United States Patent
Zhao

(10) Patent No.: US 10,717,644 B2
(45) Date of Patent: Jul. 21, 2020

(54) MICROELECTRO-MECHANICAL SYSTEM DEVICE AND METHOD FOR ELECTROSTATIC BONDING THE SAME

(71) Applicant: UNITED MICROELECTRONICS CORP., Hsin-Chu (TW)

(72) Inventor: Linlin Zhao, Singapore (SG)

(73) Assignee: UNITED MICROELETRONICS CORP., Hsin-Chu (TW)

( * ) Notice: Subject to any disclaimer, the term of this patent is extended or adjusted under 35 U.S.C. 154(b) by 410 days.

(21) Appl. No.: 15/641,194

(22) Filed: Jul. 3, 2017

(65) Prior Publication Data
US 2018/0362336 A1    Dec. 20, 2018

(30) Foreign Application Priority Data

Jun. 15, 2017  (TW) .............................. 106119926 A

(51) Int. Cl.
| | |
|---|---|
| H02K 41/02 | (2006.01) |
| B81C 1/00 | (2006.01) |
| B81C 99/00 | (2010.01) |
| B81B 3/00 | (2006.01) |
| B81C 3/00 | (2006.01) |

(52) U.S. Cl.
CPC ........ B81C 1/00269 (2013.01); B81B 3/0021 (2013.01); B81C 3/001 (2013.01); B81C 99/0025 (2013.01); B81B 2203/0127 (2013.01); B81C 2203/0118 (2013.01); B81C 2203/031 (2013.01); B81C 2203/038 (2013.01)

(58) Field of Classification Search
CPC ............ B81C 1/00269; B81C 99/0025; B81C 2203/0118; B81C 2203/038; B81B 3/0021; B81B 2203/0127
USPC ....................................................... 310/12.03
See application file for complete search history.

(56) References Cited

U.S. PATENT DOCUMENTS

| | | | | |
|---|---|---|---|---|
| 4,410,871 A | * | 10/1983 | Mallon ................. | G01L 9/0054 257/417 |
| 6,197,139 B1 | * | 3/2001 | Ju .......................... | C03C 27/08 156/99 |
| 2007/0022814 A1 | * | 2/2007 | Seto ........................ | G01P 1/023 73/514.34 |
| 2016/0006414 A1 | * | 1/2016 | Chodavarapu ...... | B81C 1/00182 310/309 |

FOREIGN PATENT DOCUMENTS

| | | |
|---|---|---|
| CN | 102079502 A | 6/2011 |
| WO | WO9110120 | 7/1991 |

* cited by examiner

*Primary Examiner* — Jianchun Qin
(74) *Attorney, Agent, or Firm* — Winston Hsu

(57) ABSTRACT

A microelectro-mechanical system (MEMS) device includes a substrate of a semiconductor material having thereon a movable component, a glass substrate bonded to the substrate, an electrostatic biasing layer disposed between the movable component and the glass substrate. A cavity is defined between the movable component and a top surface of the glass substrate. The electrostatic biasing layer completely overlaps with the movable component.

13 Claims, 3 Drawing Sheets

MICROELECTRO-MECHANICAL SYSTEM DEVICE AND METHOD FOR ELECTROSTATIC BONDING THE SAME

CROSS REFERENCE TO RELATED APPLICATION

This application claims priority from Taiwan Patent Application Ser. No. 106119926 filed Jun. 15, 2017, which is included in its entirety herein by reference.

BACKGROUND OF THE INVENTION

1. Field of the Invention

The present invention relates to the field of microelectro-mechanical systems, and more particularly to a microelectro-mechanical system device and an electrostatic bonding method thereof.

2. Description of the Prior Art

It is known that wafer bonding techniques are commonly used in microelectro-mechanical system (MEMS) devices. In order to achieve good package airtightness, the bonding method may be selected for direct bonding techniques such as anodic or electrostatic bonding, or a dielectric (or intermediate layer) bonding technique, such as eutectic bonding.

Electrostatic bonding techniques typically require bonding at high temperatures or very high DC voltages. However, high voltage can easily lead to damage to the internal movable components of the MEMS devices.

SUMMARY OF THE INVENTION

It is one object of the invention to provide an improved microelectro-mechanical system (MEMS) device.

It is another object of the invention to provide an electrostatic bonding method for the MEMS device, which is capable of solving the above-mentioned prior art problems or shortcomings.

According to one aspect of the invention, the MEMS device includes a substrate of a semiconductor material having thereon a movable component, and a glass substrate bonded to the substrate. A cavity is defined between the movable component and a top surface of the glass substrate. An electrostatic biasing layer is disposed between the movable component and the glass substrate. The electrostatic biasing layer completely overlaps with the movable component.

According to another aspect of the invention, an electrostatic bonding method for the MEMS device is disclosed. A substrate having thereon a movable component is provided. A glass substrate having thereon an electrostatic biasing layer is prepared. A direct-current (DC) voltage is provided between the substrate and the glass substrate to electrostatic bonding the substrate and the glass substrate. The electrostatic biasing layer is located between the movable component and the glass substrate. The electrostatic biasing layer completely overlaps with the movable component. The electrostatic biasing layer and the substrate are equal potential.

These and other objectives of the present invention will no doubt become obvious to those of ordinary skill in the art after reading the following detailed description of the preferred embodiment that is illustrated in the various figures and drawings.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the invention.

Figure 1:
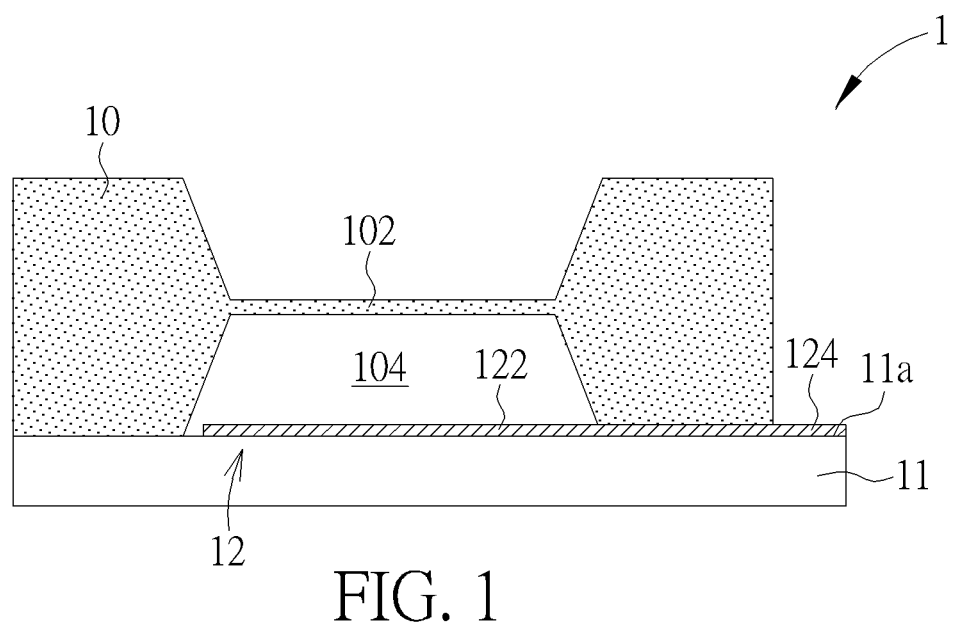
FIG. 1 is a schematic, cross-sectional diagram showing a microelectro-mechanical system (MEMS) device according to one embodiment of the invention.
Figure 2:
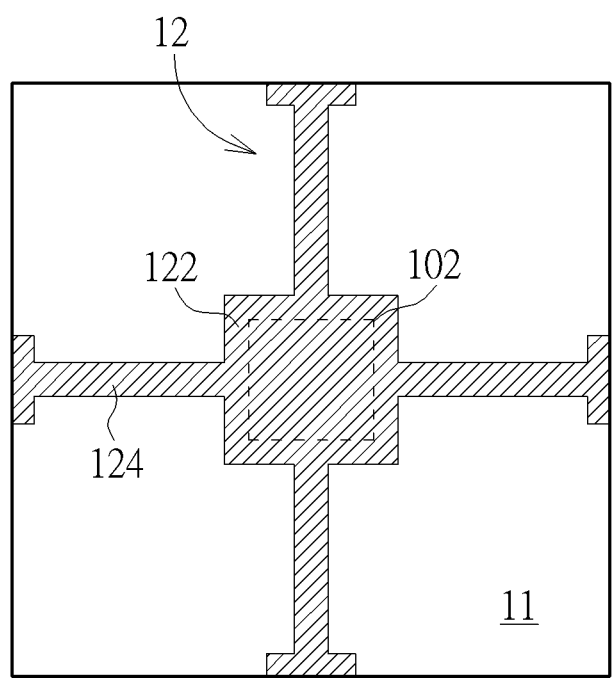
FIG. 2 is a top view of the MEMS device.

Please refer to FIG. 1 and FIG. 2. FIG. 1 is a schematic, cross-sectional diagram showing a microelectro-mechanical system (MEMS) device according to one embodiment of the invention. FIG. 2 is a top view of the MEMS device. For the sake of simplicity, the substrate is not shown in FIG. 2.

As shown in FIG. 1 and FIG. 2, the MEMS device 1 comprises a substrate 10 having thereon a movable component 102. The substrate 10 is composed of a semiconductor material such as silicon, single crystalline silicon, or polysilicon, but is not limited thereto.

According to one embodiment, the movable component 102 may comprise a diaphragm composed of the aforesaid semiconductor material. The movable component 102 is structurally integral with the substrate 10.

According to one embodiment, the MEMS device 1 further comprises a glass substrate 11 bonded to the substrate 10. According to one embodiment, a cavity 104 is defined between the movable component 102 and a top surface 11a of the glass substrate 11. According to one embodiment, the cavity 104 may be formed by etching the substrate 10. According to one embodiment, the cavity 104 may be a vacuum cavity, but is not limited thereto. In another embodiment, the cavity 104 may be a cavity filled with a specific gas.

According to one embodiment, the MEMS device 1 further comprises an electrostatic biasing layer 12 disposed between the movable component 102 and the glass substrate 11. According to one embodiment, the electrostatic biasing layer 12 is disposed directly on the top surface 11a of the glass substrate 11.

According to one embodiment, as can be best seen in FIG. 2, the electrostatic biasing layer 12 comprises a central portion 122 situated directly under the movable component 102, and at least one lead 124 extended from a side edge of the central portion 122. In the embodiment as depicted in FIG. 2, the central portion 122 has a rectangular outline including four side edges and four leads 124 extend from the four side edges of the central portion 122 to the perimeter of the device. As shown in FIG. 2, the electrostatic biasing layer 12 completely overlaps with the movable component 102.

According to one embodiment, the lead 124 is located between the substrate 10 and the glass substrate 11. The lead 124 is in direct contact with the substrate 10 and the glass substrate 11. Since the line width and the thickness of the lead 124 are both in micrometer or nanometer scales and are relatively small and thin with respect to the substrate 10 and the glass substrate 11, so that the bonding between the substrate 10 and the glass substrate 11 is not affected.

Figure 3:
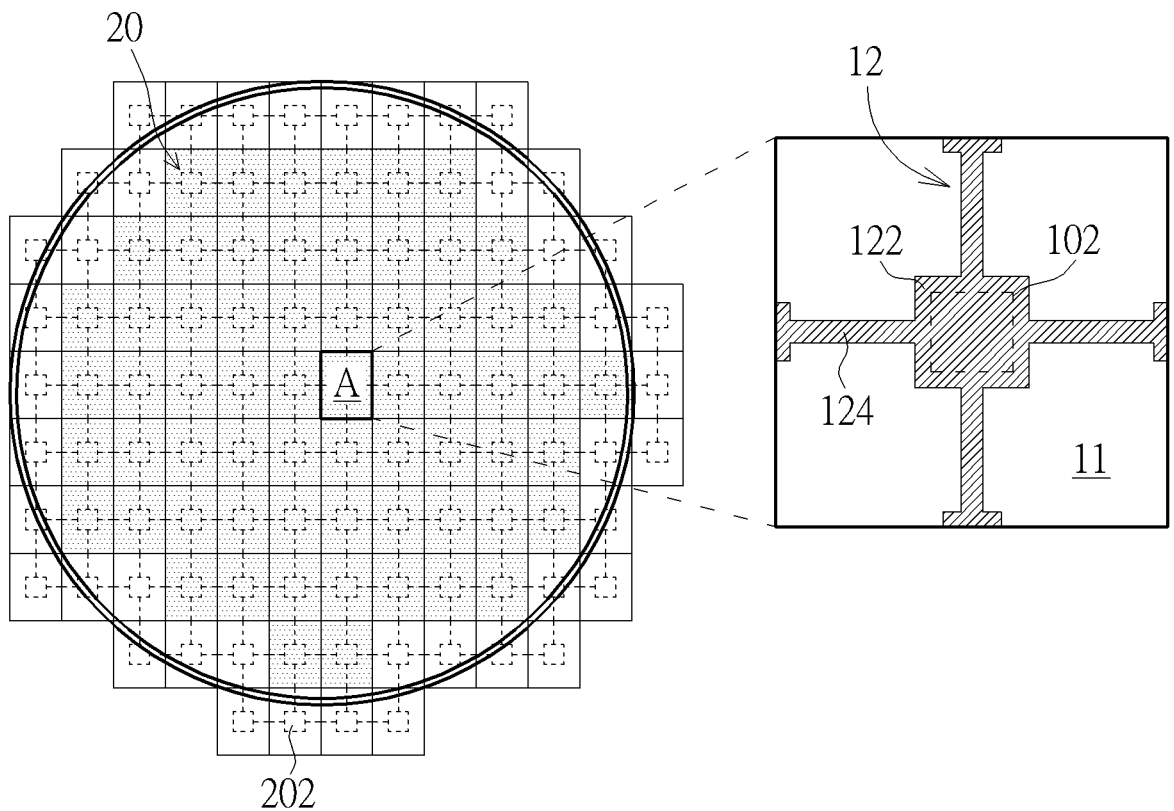
FIG. 3 is a schematic diagram showing a bonding method in wafer scale according to another embodiment of the invention.

FIG. 3 is a schematic diagram showing a bonding method in wafer scale according to another embodiment of the invention. As shown in FIG. 3, by deploying the structural features as set forth in FIG. 1 and FIG. 2, the present invention may be applicable to wafer bonding and packaging processes of MEMS devices.

For example, the layout pattern of the electrostatic biasing layer 12 may be prefabricated within each device area A across the glass substrate 11 by using methods including, but not limited to, a metal sputtering process and an etching process. The leads 124 extended from the central portions 122 are connected together between adjacent device areas A so as to form an electrostatic biasing network 20. On the wafer edge, an electrode 202 may be formed and may be electrically connected to the leads 124 and the electrostatic biasing network 20. A pre-determined voltage may be provided to the electrostatic biasing network 20 via the electrode 202 during the electrostatic bonding process. By providing the electrostatic biasing network 20 the pre-determined voltage, the damage to the movable component 102 due to the electric field effect can be avoided.

Figure 4:
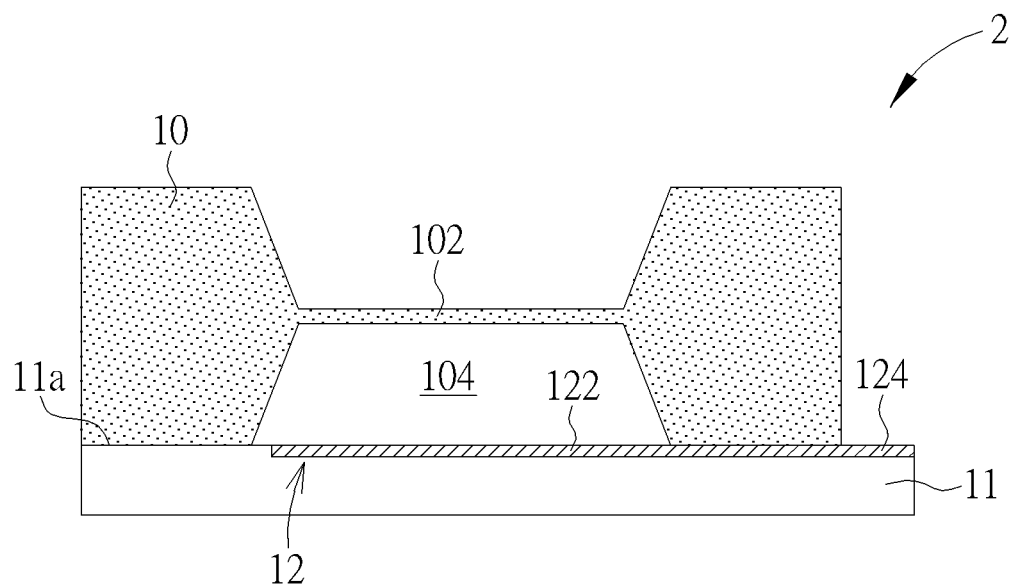
FIG. 4 is a schematic, cross-sectional diagram showing a MEMS device according to another embodiment of the invention.

FIG. 4 is a schematic, cross-sectional diagram showing a MEMS device according to another embodiment of the invention, wherein like numeral numbers designate like layers, elements or regions. As shown in FIG. 4, the MEMS device 2 is different from the MEMS device 1 in FIG. 1 in that the MEMS device 2 has the electrostatic biasing layer 12 embedded in the top surface 11a of the glass substrate 11. Therefore, the electrostatic biasing layer 12 has a top surface that is flush with the top surface 11a of the glass substrate 11. Such structure of the electrostatic biasing layer 12 may be formed by using, for example, copper damascene processes and chemical mechanical polishing (CMP) processes.

Figure 5:
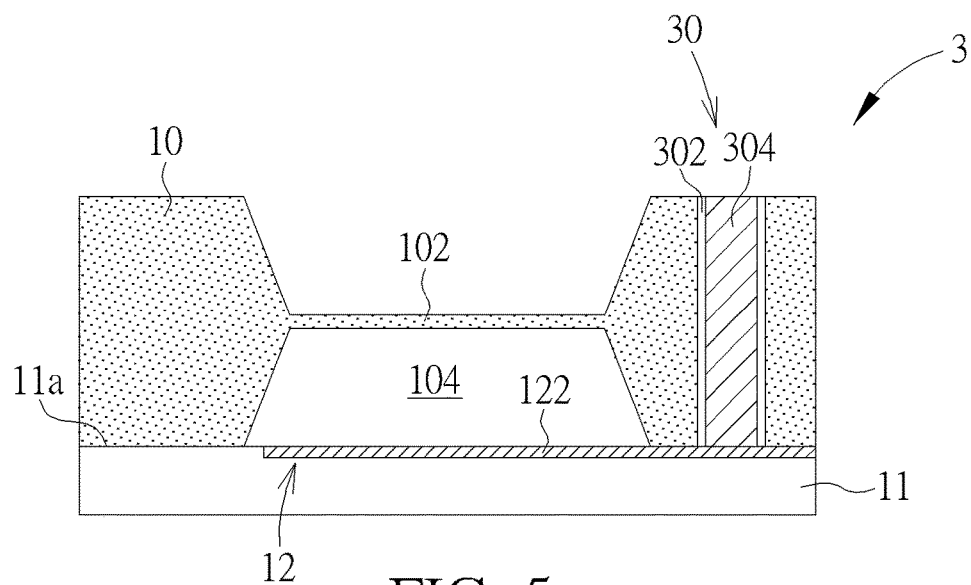
FIG. 5 is a schematic, cross-sectional diagram showing a MEMS device according to still another embodiment of the invention.

FIG. 5 is a schematic, cross-sectional diagram showing a MEMS device according to still another embodiment of the invention, wherein like numeral numbers designate like layers, elements or regions. As shown in FIG. 5, the MEMS device 3 is different from the MEMS device in FIG. 4 in that the MEMS device 3 further comprises a through-substrate via (TSV) 30 that is disposed in the substrate 10. The TSV 30 penetrates through the entire thickness of the substrate 10 such that the TSV 30 is electrically connected to the electrostatic biasing layer 12, for example, to the lead 124 of the electrostatic biasing layer 12.

According to one embodiment, the TSV 30 can be fabricated in the substrate 10 concurrently with the MEMS device 3. Alternatively, the TSV 30 can be pre-fabricated in the substrate 10 before the fabrication of the MEMS device 3. For example, the TSV 30 may comprise an insulating layer 302 and a conductive layer 304. The insulating layer 302 may comprise a silicon oxide layer, but is not limited thereto. The conductive layer 304 may comprise tungsten, copper, titanium nitride, or the like.

Figure 6:
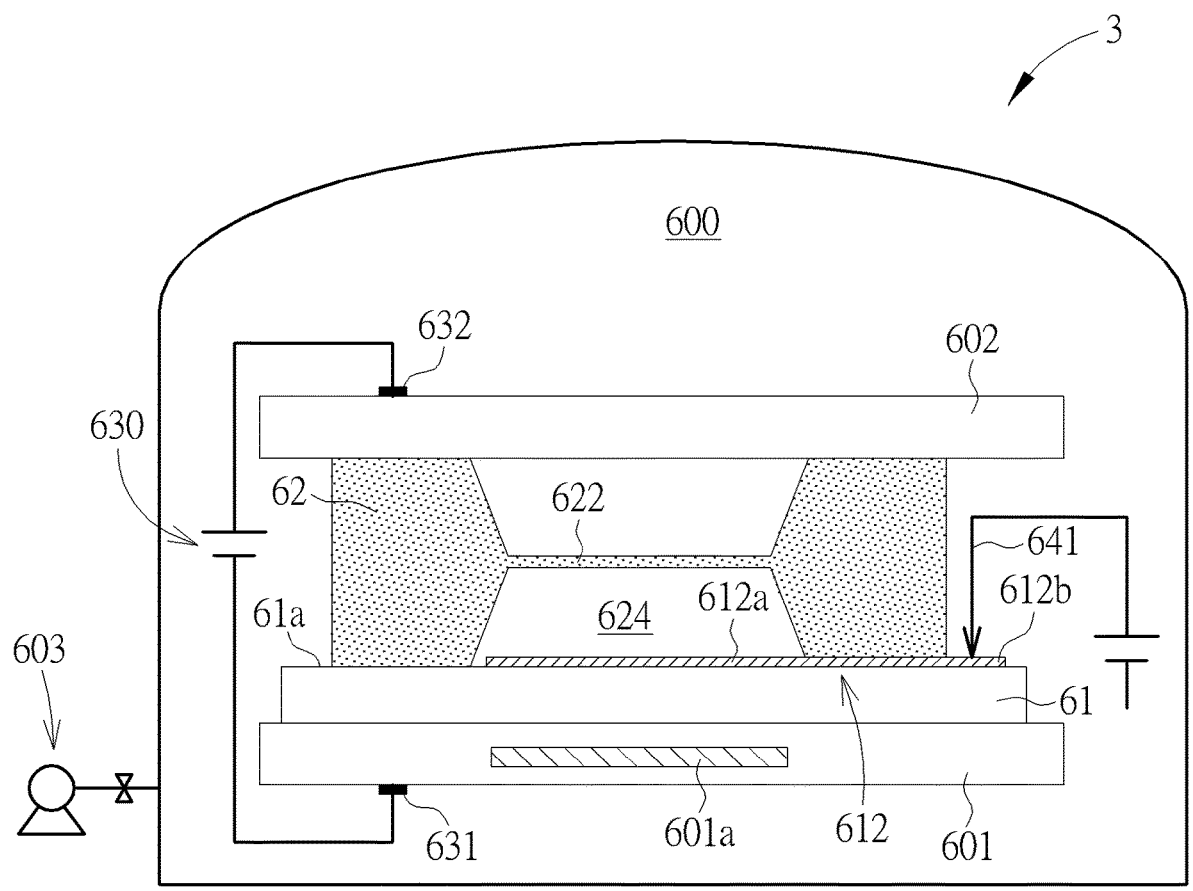
FIG. 6 is a system diagram showing the apparatus and components for electrostatic bonding according to another embodiment of the invention.

FIG. 6 is a system diagram showing the apparatus and components for electrostatic bonding according to another embodiment of the invention. As shown in FIG. 6, the apparatus 6 for electrostatic bonding method comprises a processing chamber 600. Within the processing chamber 600, a first fixing device 601 and a second fixing device 602 are disposed. The first fixing device 601 and the second fixing device 602 are parallel to each other in the processing chamber 600.

According to one embodiment, the first fixing device 601 and the second fixing device 602 respectively fix the first substrate 61 and the second substrate 62. For example, the first substrate 61 may be a glass substrate and the second substrate 62 may be a silicon wafer.

According to one embodiment, an electrostatic biasing layer 612 having the same structure as described through FIG. 1 to FIG. 5 is disposed on the first substrate 61.

According to one embodiment, the second substrate 62 has a movable component 622. A cavity 624 is defined between the movable component 622 and a top surface 61a of the first substrate 61. The electrostatic biasing layer 612 completely overlaps with the movable component 622.

According to one embodiment, the apparatus 6 for electrostatic bonding may further comprise a vacuum pump 603 coupled to the processing chamber 600 for depressurizing or evacuating the processing chamber 600, for example, to a high degree of vacuum.

According to one embodiment, the apparatus 6 for electrostatic bonding may further comprise a heating device 601a coupled to the first fixing device 601. For example, the first fixing device 601 may be a wafer chuck equipped with a heating plate.

According to one embodiment, the apparatus 6 for electrostatic bonding may further comprise a first power supply 630 for applying a direct-current (DC) voltage, for example, 200V to 1000V, between the first substrate 61 and the second substrate 62. The first power supply 61 comprises an anode electrode 632 coupled to the second fixing device 602 and a cathode electrode 631 coupled to the first fixing device 601.

According to one embodiment, the apparatus 6 for electrostatic bonding may further comprise a retractable electrode 641 disposed within the processing chamber 600. The retractable electrode 641 may be electrically connected to a second power supply 640. During electrostatic bonding, the retractable electrode 641 may be electrically connected with the electrostatic biasing layer 612 such that the electrostatic biasing layer 612 on the first substrate 61 and the second fixing device 602 coupled to the anode electrode 632 of the first power supply 630 are equal potential.

According to one embodiment, the electrostatic biasing layer 612 comprises a central portion 612a directly and at least one lead 612b extended from a side edge of the central portion 612a. The retractable electrode 641 is in contact with the at least one lead 612b during electrostatic bonding. By providing this configuration, the electrostatic biasing layer 612 protects the movable component 622 that completely overlaps with the electrostatic biasing layer 612 from the damage resulted from electrostatic force.

It is noteworthy that, in another embodiment, if the silicon wafer adopts the structure as described in FIG. 5, the retractable electrode 641 may be omitted. In this case, the second fixing device 602 may be in direct contact with the TSV in the second substrate 62 and may be electrically connected to the electrostatic biasing layer 612 through the TSV in the second substrate 62.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A microelectro-mechanical system (MEMS) device, comprising:
    a substrate of a semiconductor material having thereon a movable component;
    a glass substrate bonded to the substrate, wherein a cavity is defined between the movable component and a top surface of the glass substrate; and
    an electrostatic biasing layer disposed between the movable component and the glass substrate, wherein the electrostatic biasing layer completely overlaps with the movable component, wherein the electrostatic biasing layer comprises a central portion being of a rectangular shape directly under the movable component and at least one lead extended from a side edge of the central portion, wherein a portion of the glass substrate is directly contacting the substrate of the semiconductor material, wherein the electrostatic biasing layer is embedded in the top surface of the glass substrate, wherein the top surface of the glass substrate is coplanar with the top surface of the electrostatic biasing layer.

2. The MEMS device according to claim 1, wherein the semiconductor material comprises silicon.

3. The MEMS device according to claim 1, wherein the movable component comprises a diaphragm composed of the semiconductor material, wherein the diaphragm has at least two shapes in accordance with changes in electrostatic force.

4. The MEMS device according to claim 1, wherein the movable component is structurally integral with the substrate.

5. The MEMS device according to claim 1, wherein the cavity is a vacuum cavity.

6. The MEMS device according to claim 1, wherein the electrostatic biasing layer is disposed on the top surface of the glass substrate.

7. The MEMS device according to claim 1 further comprising:
    a through substrate via in the substrate, wherein the through substrate via is electrically connected to the electrostatic biasing layer.

8. The MEMS device according to claim 1, wherein only the at least one lead is interposed and directly disposed between the substrate and the glass substrate, directly contacting both of the substrate and the glass substrate.

9. An electrostatic bonding method for a microelectro-mechanical system (MEMS) device, comprising:
    providing a substrate having thereon a movable component;
    providing a glass substrate having thereon an electrostatic biasing layer; and
    applying a direct-current (DC) voltage between the substrate and the glass substrate to electrostatic bonding the substrate and the glass substrate, wherein the electrostatic biasing layer is located between the movable component and the glass substrate, and the electrostatic biasing layer completely overlaps with the movable component, wherein the electrostatic biasing layer and the substrate are equal potential, wherein the electrostatic biasing layer comprises a central portion being of a rectangular shape directly under the movable component and at least one lead extended from a side edge of the central portion, wherein the electrostatic biasing layer is embedded in the top surface of the glass substrate, wherein the top surface of the glass substrate is coplanar with the top surface of the electrostatic biasing layer.

10. The electrostatic bonding method for a MEMS device according to claim 9, wherein a cavity is disposed between the movable component and a top surface of the glass substrate.

11. The electrostatic bonding method for a MEMS device according to claim 9 further comprising:
    contacting the electrostatic biasing layer with a retractable electrode so that the electrostatic biasing layer and the substrate are equal potential.

12. The electrostatic bonding method for a MEMS device according to claim 11, wherein the retractable electrode is in contact with the at least one lead.

13. The electrostatic bonding method for a MEMS device according to claim 9, wherein the glass substrate is disposed on a wafer chuck equipped with a heating plate.

* * * * *